(12) United States Patent
Vakilian

(10) Patent No.: US 7,956,687 B2
(45) Date of Patent: Jun. 7, 2011

(54) CONSTANT-BANDWIDTH VARIABLE GAIN AMPLIFIER

(75) Inventor: Kambiz Vakilian, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/481,699

(22) Filed: Jun. 10, 2009

(65) Prior Publication Data

US 2010/0315164 A1    Dec. 16, 2010

(51) Int. Cl.
*H03F 3/45* (2006.01)
(52) U.S. Cl. ........................................................ 330/254
(58) Field of Classification Search .......... 330/252–261, 330/283
See application file for complete search history.

(56) References Cited

U.S. PATENT DOCUMENTS 6,870,404 B1 * 3/2005 Maangat .......................... 327/65
2009/0261899 A1 * 10/2009 Gomez et al. ..................... 330/2

* cited by examiner

*Primary Examiner* — Robert Pascal
*Assistant Examiner* — Hieu P Nguyen
(74) *Attorney, Agent, or Firm* — Sterne, Kessler, Goldstein & Fox, P.L.L.C.

(57) ABSTRACT

The performance of an AGC loop typically depends on several factors, including gain linearity of the VGA and variation in the VGA bandwidth over the range of available gain settings. Although a resistively degenerated VGA provides for excellent gain linearity and immunity to process variations, the conventional architecture for a resistively degenerated VGA suffers from bandwidth variation over the range of available gain settings. Embodiments are provided herein of a constant-bandwidth VGA that utilizes resistive degeneration. To maintain a constant bandwidth over the range of available gain settings, degeneration resistors are coupled in parallel with compensation capacitors. In an embodiment, a compensation capacitor is determined to have a capacitance substantially equal to the decrease in total degeneration resistance that occurs as a result of an associated degeneration resistor being placed in parallel with the total degeneration resistance.

21 Claims, 6 Drawing Sheets

CONSTANT-BANDWIDTH VARIABLE GAIN AMPLIFIER

FIELD OF THE INVENTION

This application relates generally to amplifiers and, more specifically, to variable gain amplifiers.

BACKGROUND

In many applications, amplification of a weak electrical signal is desired and necessary. For example, in high-speed serial receivers, a signal received over a communication link may be comparatively weaker than the noise contributed by processing stages in the receiver. Therefore, prior to substantive processing, the weak signal is often amplified such that the received signal is not "lost" within the noise.

In general, amplification of a signal may be performed by a fixed or variable gain amplifier (VGA). More complex designs, such as high-speed serial receivers, may make use of a VGA within an automated gain control (AGC) loop. In an AGC loop, the output of the VGA is feed back to a controller, which adjusts the gain of the VGA based on a function of the VGA output.

The performance of an AGC loop typically depends on several factors, including gain linearity of the VGA and variation in the VGA bandwidth over the range of available gain settings. A resistively degenerated amplifier is one desirable architecture for the implementation of a VGA within an AGC loop. A resistively degenerated amplifier exhibits excellent gain linearity and immunity to process variations. However, the conventional architecture for a resistively degenerated VGA suffers from bandwidth variation over the range of available gain settings.

Therefore, there exists a need for a resistively degenerated VGA that provides for constant-bandwidth over the operating gain range.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Exemplary Operating Environment

Figure 1:
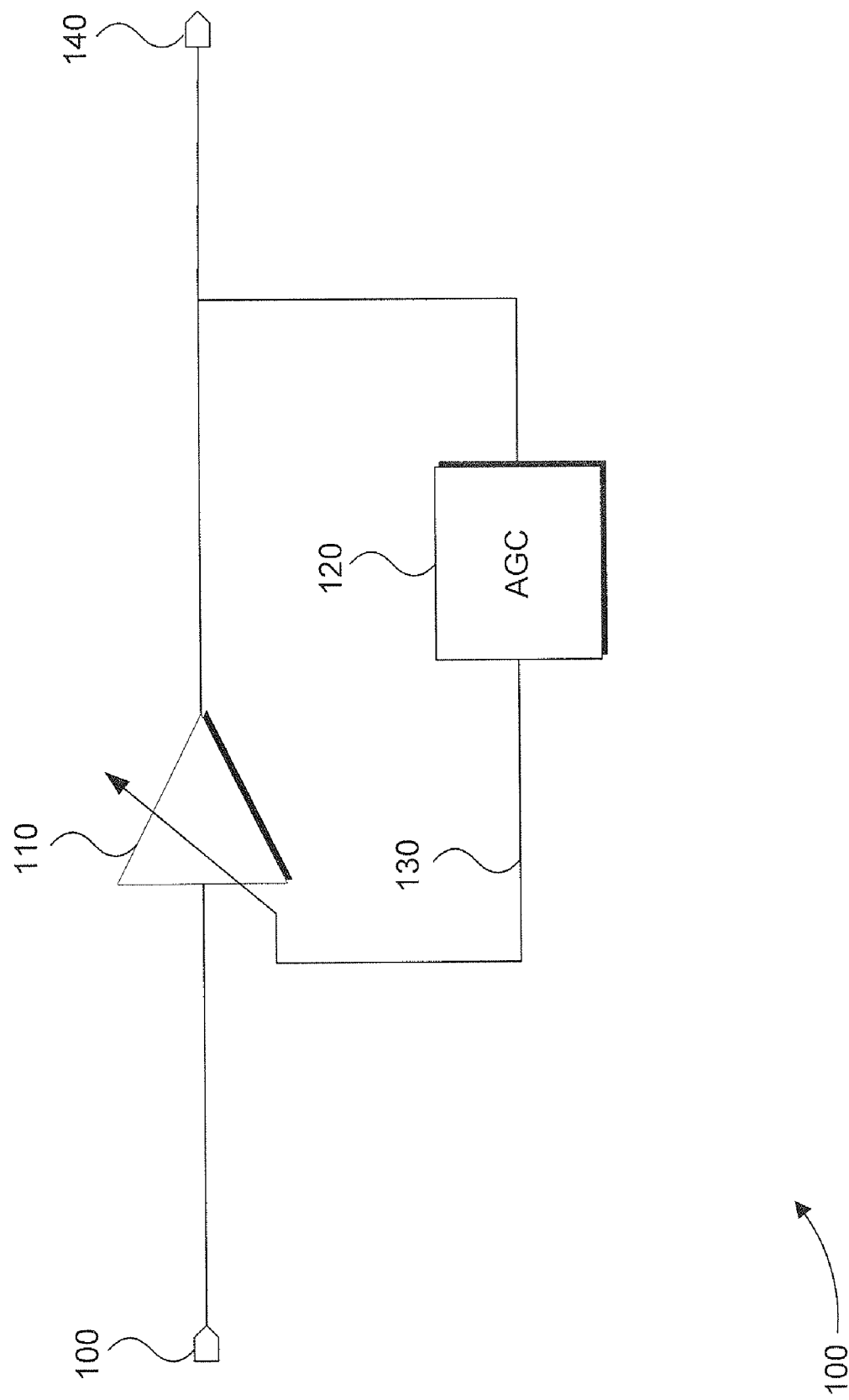
FIG. 1 illustrates a simplified block diagram of an automatic gain control (AGC) loop according to embodiments of the present invention.

FIG. 1 illustrates a simplified block diagram of an automatic gain control (AGC) loop 100 according to embodiments of the present invention. AGC loop 100 can be used in several applications, including, for example, high-speed serial communication receivers. AGC loop 100 includes an input terminal 100, a variable gain amplifier (VGA) 110, an automatic gain controller 120, a gain control signal 130, and an output terminal 140. Input terminal 100 and output terminal 140 can be either single ended, differential, or any combination thereof.

AGC loop 100 functions to receive a signal at input terminal 100 and provide an amplified version of the received signal at output terminal 140. In AGC loop 100, the output of VGA 110 is feed back to automatic gain controller 120, which adjusts the gain of VGA 110 via gain control signal 130. The gain of VGA 110 is adjusted by controller 120 based on a function of the output of VGA 110.

In general, AGC loops, such as AGC loop 100, are adaptive systems that function to maintain a desired amplifier output signal level by adjusting the amplifier gain. The performance of an AGC loop typically depends on several factors, including gain linearity of the VGA and variation in the VGA bandwidth over the range of available gain settings.

A resistively degenerated amplifier is one desirable architecture for the implementation of a VGA within an AGC loop. A resistively degenerated amplifier exhibits excellent gain linearity and immunity to process variations. However, the conventional architecture for a resistively degenerated VGA suffers from bandwidth variation over the range of available gain settings.

Therefore, there exists a need for a resistively degenerated VGA that provides for constant-bandwidth over the operating gain range.

Conventional Variable Gain Amplifier

Figure 2:
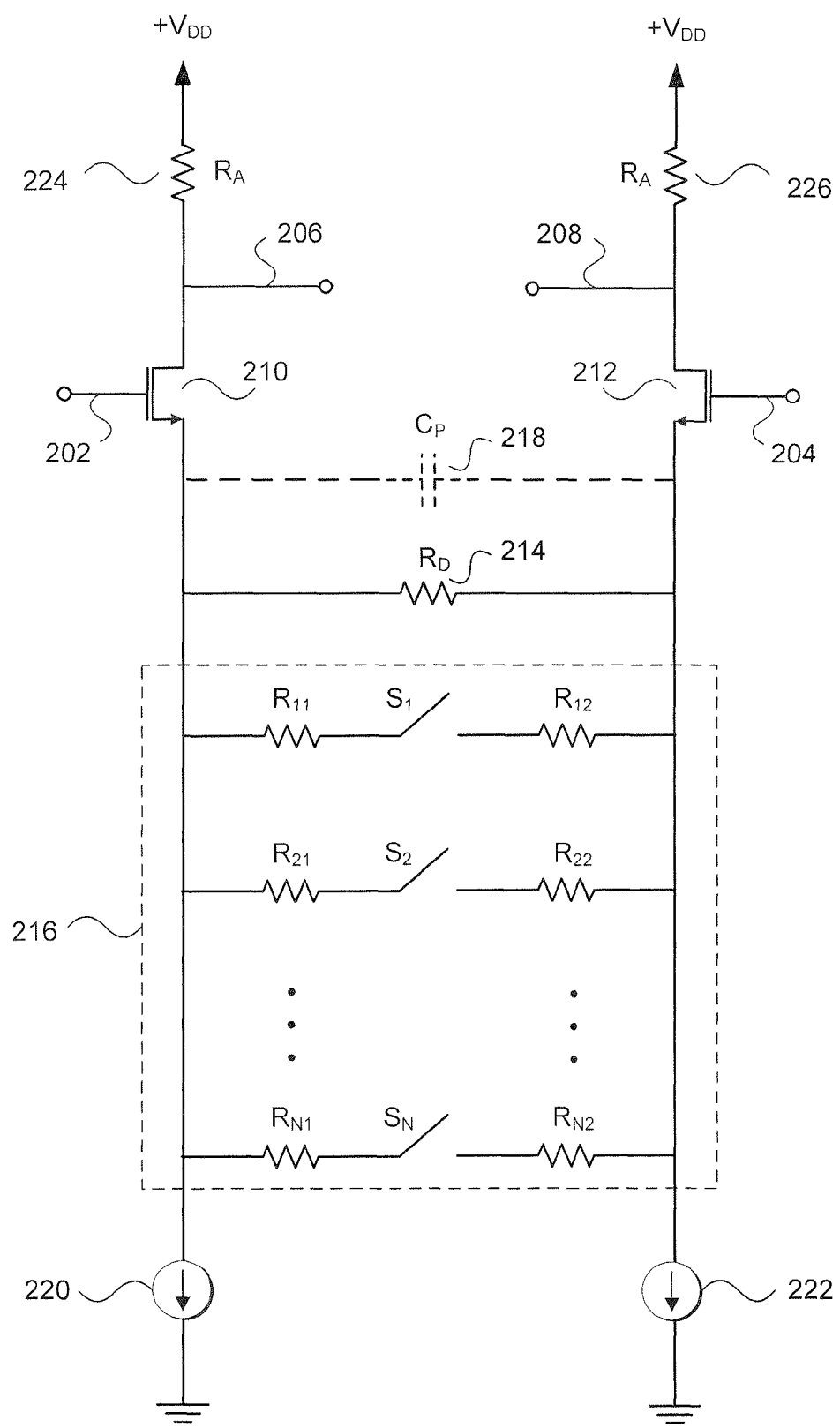
FIG. 2 illustrates a conventional variable gain amplifier utilizing resistive degeneration.

FIG. 2 illustrates a conventional variable gain amplifier (VGA) 200 utilizing resistive degeneration.

As shown in FIG. 2, conventional VGA 200 is a differential amplifier having a differential input at terminal nodes 202 and 204 and a differential output at terminal nodes 206 and 208. Conventional VGA 200 further implements a source-coupled pair (SCP) having two field-effect transistors (FETs) 210 and 212 connected together at their sources via degeneration resistor 214 and resistive degeneration circuit 216. The sources of FETs 210 and 212 are respectively coupled to ground through constant current sources 220 and 222. The drains of FETs 210 and 212 are respectively coupled through pull-up resistors 224 and 226 to a positive voltage source $V_{DD}$.

Resistive degeneration circuit 216 includes a plurality of parallel resistive branches. In FIG. 2, conventional VGA 200 includes n resistive branches within circuit 216; each branch has two series coupled resistors and a controllable switch. For example, the first branch of resistive degeneration circuit 216 includes two resistors $R_{11}$ and $R_{12}$ coupled in series through a controllable switch $S_1$.

It can be shown that the small-signal voltage gain of conventional VGA 200 is approximately equal to (ignoring parasitics):

$$G_v = \frac{g_m R_A}{1 + \frac{g_m R_{TD}}{2}}$$

where $g_m$ is the transconductance associated with FETS 210 and 212, $R_A$ is the value of pull-up resistors 224 and 226, and $R_{TD}$ is the value of the total degeneration resistance coupled between the sources of transistors 210 and 212. Assuming that $$\frac{g_m R_{TD}}{2} \gg 1$$

the above gain equation can be further simplified to:

$$G_v = 2\frac{R_A}{R_{TD}}$$

A benefit realized through the use of source degeneration is that the small-signal voltage (and current) gain is made much less dependent on the transconductance $g_m$ and, therefore, the device characteristics of FETS 210 and 212. Consequently, the small-signal voltage (and current) gain is generally immune to process variations that are common among FET devices, such as FETS 210 and 212.

Moreover, the small-signal voltage (and current) gain can be linearly adjusted by varying the total degeneration resistance coupled between the sources of transistors 210 and 212: Increasing $R_{TD}$ results in a linearly related decrease in the small-signal voltage gain, and decreasing $R_{TD}$ results in a linearly related increase in the small-signal voltage gain.

The gain of conventional VGA 200 is therefore controllable by switching on/off appropriate ones of the controllable switches (e.g., switches $S_1$ through $S_n$) in circuit 216. As more of the controllable switches are turned on, the total parallel resistance presented by resistive degeneration circuit 216, referred to herein as $R_{216}$, decreases and, conversely, as more of the controllable switches are turned off the total parallel resistance presented by resistive degeneration circuit 216 increases. The total degeneration resistance coupled between the sources of transistors 210 and 212 is given by (ignoring parasitics):

$$R_{TD} = \frac{R_D \cdot R_{216}}{R_D + R_{216}}$$

where $R_D$ is the value of resistor 214 and $R_{216}$ is the value of the total resistance presented by resistive degeneration circuit 216.

Although conventional VGA 200 of FIG. 2 provides good gain linearity, there exists a zero in the small-signal voltage gain equation (described above) due to the total degeneration resistance $R_{TD}$ being in parallel with a parasitic capacitance 218. Specifically, parasitic capacitance 218 results in the addition of a zero to the small-signal voltage gain of conventional VGA 200 that has a frequency location given by:

$$f_z = \frac{1}{2 \cdot \pi \cdot R_{TD} \cdot C_P}$$

where $C_P$ is the value of parasitic capacitance 218. In high-frequency applications, such as in a high-speed serial communications, the parasitic capacitance typically cannot be ignored. It should be noted that parasitic capacitance 218 is not intentionally placed in conventional VGA 200, but is the result of parasitic capacitances associated with the components and the connections that couple the components in conventional VGA 200.

As can be seen from the above equation, the location of the zero changes with the value of the total degeneration resistance $R_{TD}$ during gain adjustments. Therefore, the zero introduces undesirable bandwidth variation in conventional VGA 200; that is, the bandwidth of conventional VGA 200 is not constant across different gain settings.

Figure 3:
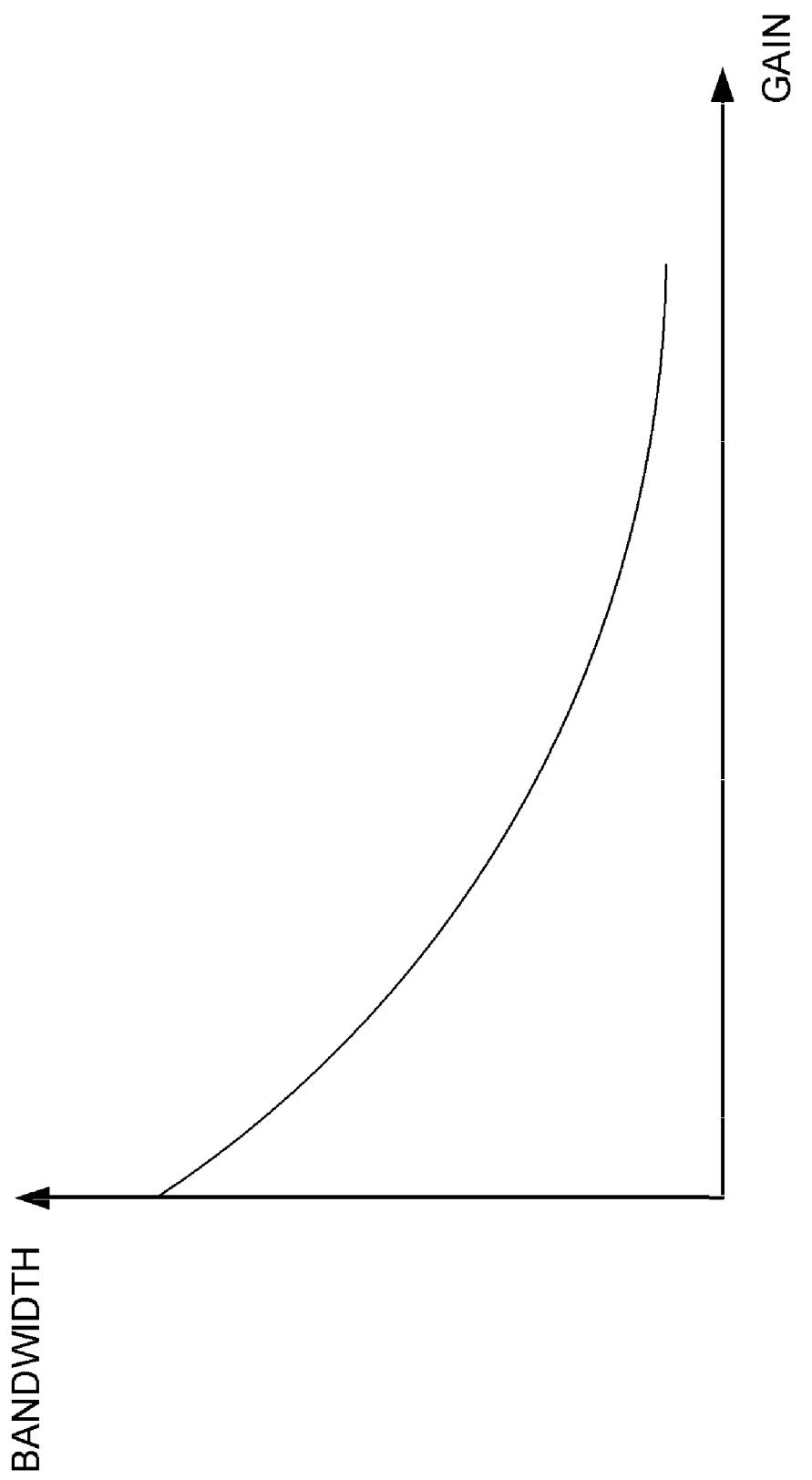
FIG. 3 illustrates the general bandwidth versus gain of the conventional variable gain amplifier illustrated in FIG. 2.

FIG. 3 illustrates the approximate bandwidth versus gain 300 of conventional VGA 200 illustrated in FIG. 2. As illustrated in FIG. 3, parasitic capacitance results in a frequency dependent gain. In general, the bandwidth of conventional VGA 200 decreases as the gain increases.

A non-constant bandwidth versus gain relationship has several associated disadvantages. For example, desired, high-frequency components of an input signal may not achieve adequate gain due to the decreased bandwidth of VGA 200 at higher gain settings. Although a further increase in the gain of VGA 200 may be used to compensate for high-frequency gain roll-off, noise at lower-frequencies (not affected by the high-frequency gain roll-off) may receive further, undesired amplification. Such a simple solution is often inadequate in many applications.

A flat gain (i.e., a constant gain over all frequencies within an operating range) is typically desired in VGA designs, including VGAs implemented in AGC loop configurations, such as AGC loop 100 illustrated in FIG. 1. Therefore, there exists a need for a resistively degenerated VGA that provides for constant-bandwidth over a wide range of gain settings.

Constant-Bandwidth Variable Gain Amplifier

Figure 4:
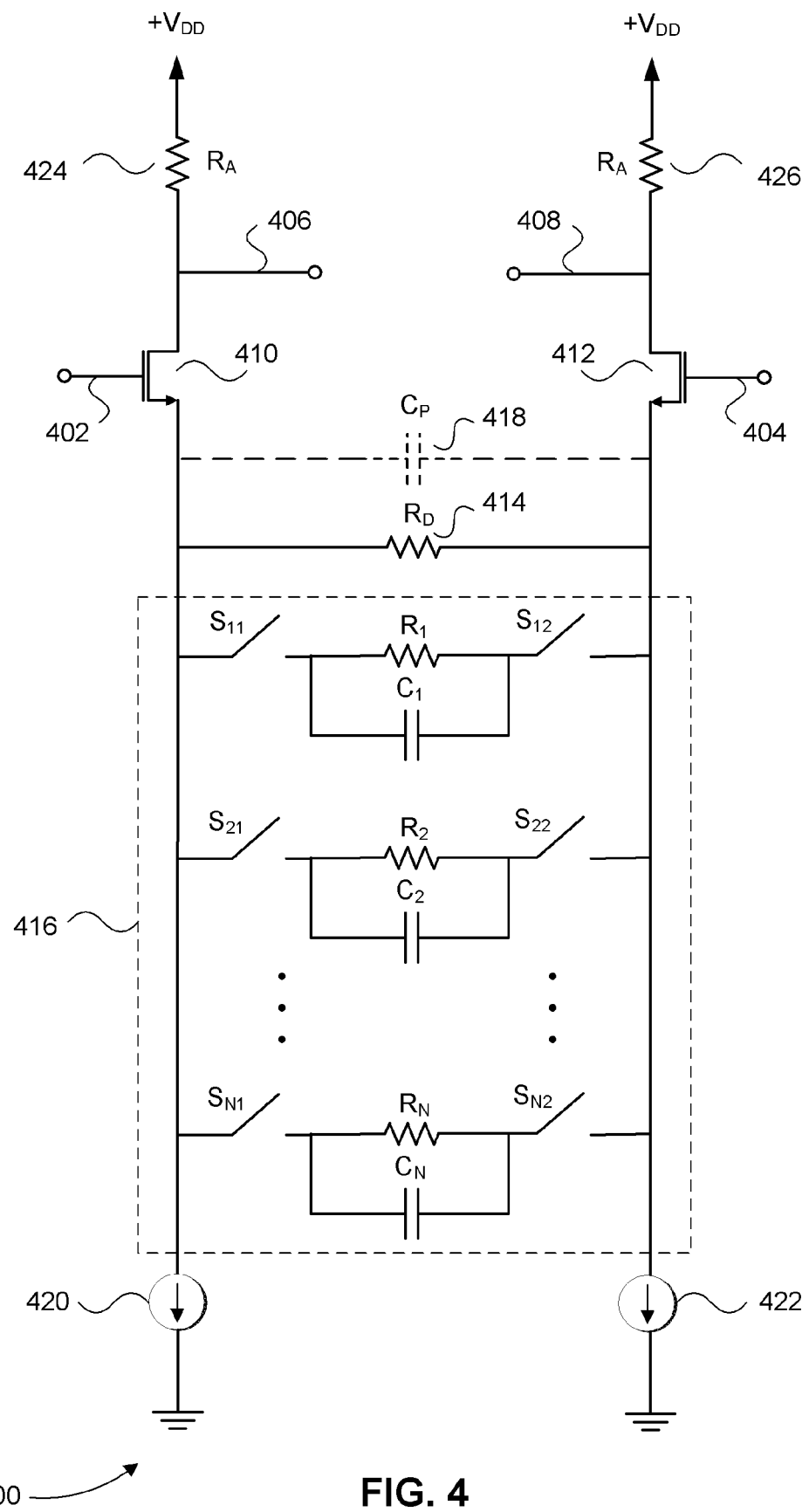
FIG. 4 illustrates a constant-bandwidth variable gain amplifier utilizing resistive degeneration, according to embodiments of the present invention.

FIG. 4 illustrates a constant-bandwidth variable gain amplifier (VGA) 400 utilizing resistive degeneration, according to embodiments of the present invention.

As shown in FIG. 4, constant-bandwidth VGA 400 is a differential amplifier having a differential input at terminal nodes 402 and 404 and a differential output at terminal nodes 406 and 408. Constant-bandwidth VGA 400 further implements a source-coupled pair (SCP) having two field-effect transistors (FETs) 410 and 412 connected together at their sources via degeneration resistor 414 and resistive degeneration circuit 416. The sources of FETs 410 and 412 are respectively coupled to ground through constant current sources 420 and 422. The drains of FETs 410 and 412 are respectively coupled through pull-up resistors 424 and 426 to a positive voltage source $V_{DD}$.

Resistive degeneration circuit 416 includes a plurality of parallel resistive branches. Each resistive branch includes a parallel combination of a resistor and a compensation capacitor coupled to the sources of FETs 410 and 412 through two controllable switches. For example, the first branch of resistive degeneration circuit 416 includes a parallel combination of resistor $R_1$ and compensation capacitor $C_1$ coupled to the sources of FETs 410 and 412 through controllable switches $S_{11}$ and $S_{12}$. In FIG. 4, conventional VGA 400 includes n resistive branches within circuit 416.

It can be shown that the small-signal voltage gain of conventional VGA 400 is approximately equal to (ignoring parasitics and compensation capacitors):

$$G_v = \frac{g_m R_A}{1 + \frac{g_m R_{TD}}{2}}$$

where $g_m$ is the transconductance associated with FETS 410 and 412, $R_A$ is the value of pull-up resistors 424 and 426, and $R_{TD}$ is the value of the total degeneration resistance coupled between the sources of transistors 410 and 412. Assuming that $$\frac{g_m R_{TD}}{2} \gg 1$$

the above gain equation can be further simplified to:

$$G_v = 2 \frac{R_A}{R_{TD}}$$

A benefit realized through the use of source degeneration is that the small-signal voltage (and current) gain is made much less dependent on the transconductance $g_m$ and, therefore, the device characteristics of FETS 410 and 412. Consequently, the small-signal voltage (and current) gain is generally immune to process variations that are common among FET devices, such as FETS 410 and 412.

Moreover, the small-signal voltage (and current) gain can be linearly adjusted simply by varying the total degeneration resistance coupled between the sources of transistors 410 and 412: Increasing $R_{TD}$ results in a linearly related decrease in the small-signal voltage gain, and decreasing $R_{TD}$ results in a linearly related increase in the small-signal voltage gain.

The gain of constant-bandwidth VGA 400 is therefore controllable by switching on/off appropriate ones of the controllable switches (e.g., switches $S_{11}$-$S_{N1}$ and $S_{12}$-$S_{N2}$) in circuit 416. As more pairs of the controllable switches are turned on, the total parallel resistance presented by resistive degeneration circuit 416, referred to herein as $R_{416}$, decreases and, conversely, as more of the controllable switches are turned off the total parallel resistance presented by resistive degeneration circuit 416 increases. For example, turning on controllable switches $S_{11}$ and $S_{12}$ couples resistor $R_1$ to the sources of transistors 410 and 412 and reduces the total parallel resistance presented by resistive degeneration circuit 416.

The total degeneration resistance coupled between the sources of transistors 410 and 412 is given by (ignoring parasitics):

$$R_{TD} = \frac{R_D \cdot R_{416}}{R_D + R_{416}}$$

where $R_D$ is the value of resistor 414 and $R_{16}$ is the value of the total resistance presented by resistive degeneration circuit 416.

Although constant-bandwidth VGA 400 of FIG. 4 provides good gain linearity, there exists a zero in the small-signal voltage gain equation (described above) due to the total degeneration resistance $R_{TD}$ being in parallel with a parasitic capacitance 418. Specifically, parasitic capacitance 418 results in the addition of a zero to the small-signal voltage gain of constant-bandwidth VGA 400 that has a frequency location given by:

$$f_z = \frac{1}{2 \cdot \pi \cdot R_{TD} \cdot C_P}$$

where $C_P$ is the value of parasitic capacitance 418.

As can be seen from the above equation, the frequency location of the zero changes with the value of the total degeneration resistance $R_{TD}$ during gain adjustments. To compensate for this shift in location of the zero, each resistive branch in circuit 416 includes a compensation capacitor (e.g., $C_1$) in parallel with a resistor (e.g., $R_1$).

In an embodiment, the value of one or more compensation capacitors is determined to have a capacitance substantially equal to the decrease in the total resistance value $R_{TD}$ that occurs as a result of its associated resistor being coupled to the sources of transistors 410 and 412. For example, the value of compensation capacitor $C_1$ is determined to have a capacitance substantially equal to the decrease in the total resistance value $R_{TD}$ that occurs as a result of resistor $R_1$ being coupled to the sources of transistors 410 and 412.

In another embodiment, the value of one or more compensation capacitors is determined during simulation to have a capacitance that substantially compensates for the shift in the location of the zero due to its associated resistor being coupled to the sources of transistors 410 and 412. Simulation of constant-bandwidth VGA 400 may provide better consideration for additional parasitics that result when a parallel combination of a degeneration resistor and compensation capacitor are coupled to the sources of transistors 410 and 412. For example, the traces coupled to degeneration resistor $R_1$ and compensation capacitor $C_1$ can be further accounted for during simulation.

In general, compensation capacitors $C_1$-$C_N$ function to maintain the location of the zero and, therefore, the bandwidth of constant-bandwidth VGA 400 across the range of available gain settings. The compensation capacitors, in effect, add to parasitic capacitance 418 of value $C_P$.

Constant-bandwidth VGA 400 is provided for the purpose of illustration and not limitation. Other equivalent implementations and/or variations of constant-bandwidth VGA 400 are possible as would be understood by a person skilled in the art based on the teachings herein. Equivalent implementations and/or variations may include, for example, variations in transistor type (e.g., BJT, PNP, JFET, etc.), variations in amplifier configuration (e.g., common-drain, common-gate, common-collector, common-base, Darlington pair, Cascode, Sziklai pair, etc.), and variations in amplifier input/output configuration (e.g., single-ended, single-input-single-output, single-input-multiple-output, etc.). In addition, degeneration resistors and compensation capacitors can be coupled between the sources of transistors 410 and 412 using any suitable configuration, which may include one or more controllable switches.

Figure 5:
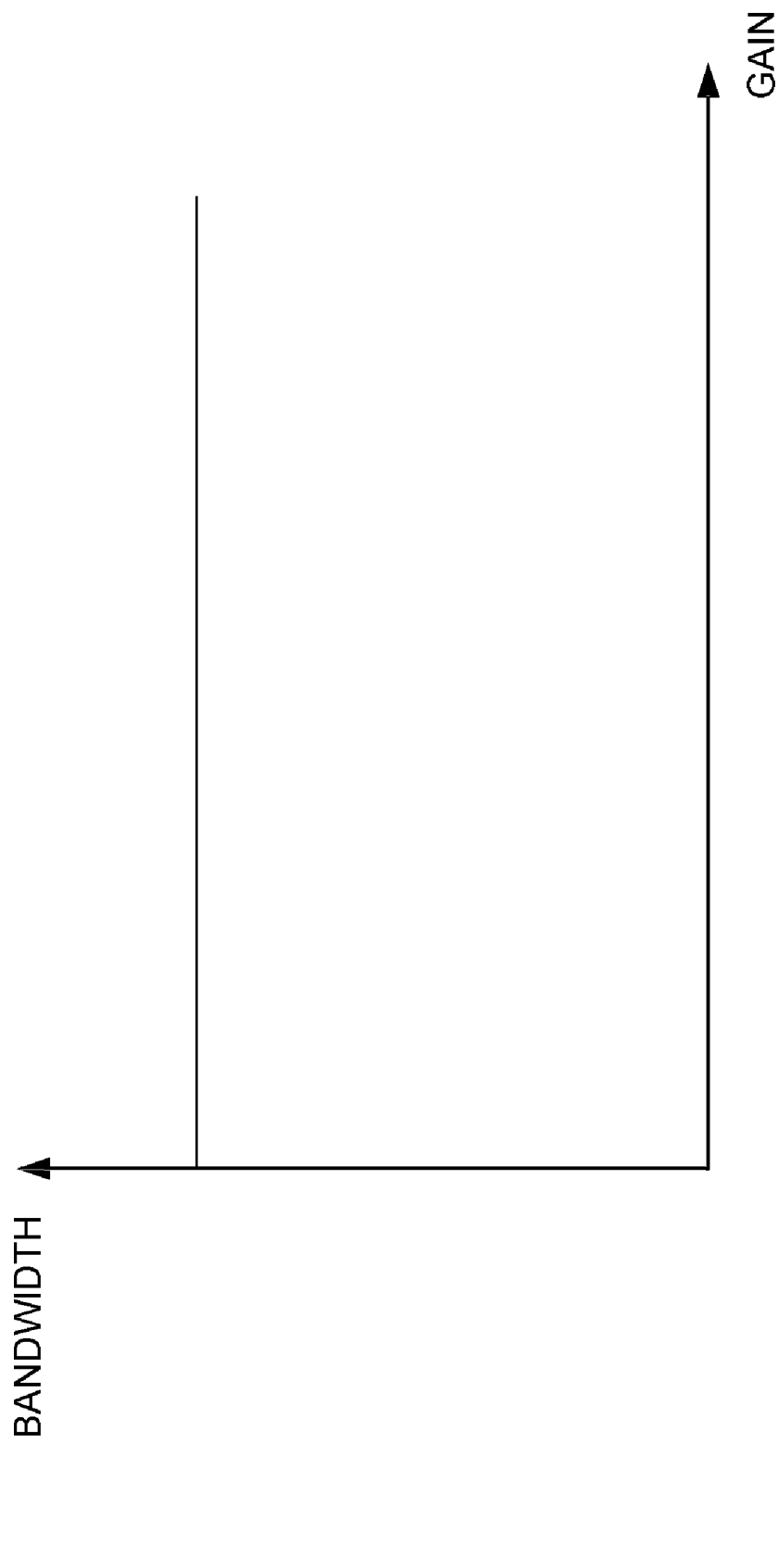
FIG. 5 illustrates the general bandwidth versus gain of the constant-bandwidth variable gain amplifier illustrated in FIG. 4, according to embodiments of the present invention.

FIG. 5 illustrates the approximate bandwidth versus gain 500 of constant-bandwidth VGA 400 illustrated in FIG. 4. As illustrated in FIG. 5, a flat gain is achieved over the range of available gain settings. A flat gain (i.e., a constant gain over all frequencies within an operating range) is typically desired in VGA designs, including VGAs implemented in AGC loop configurations, such as AGC loop 100 illustrated in FIG. 1.

Figure 6:
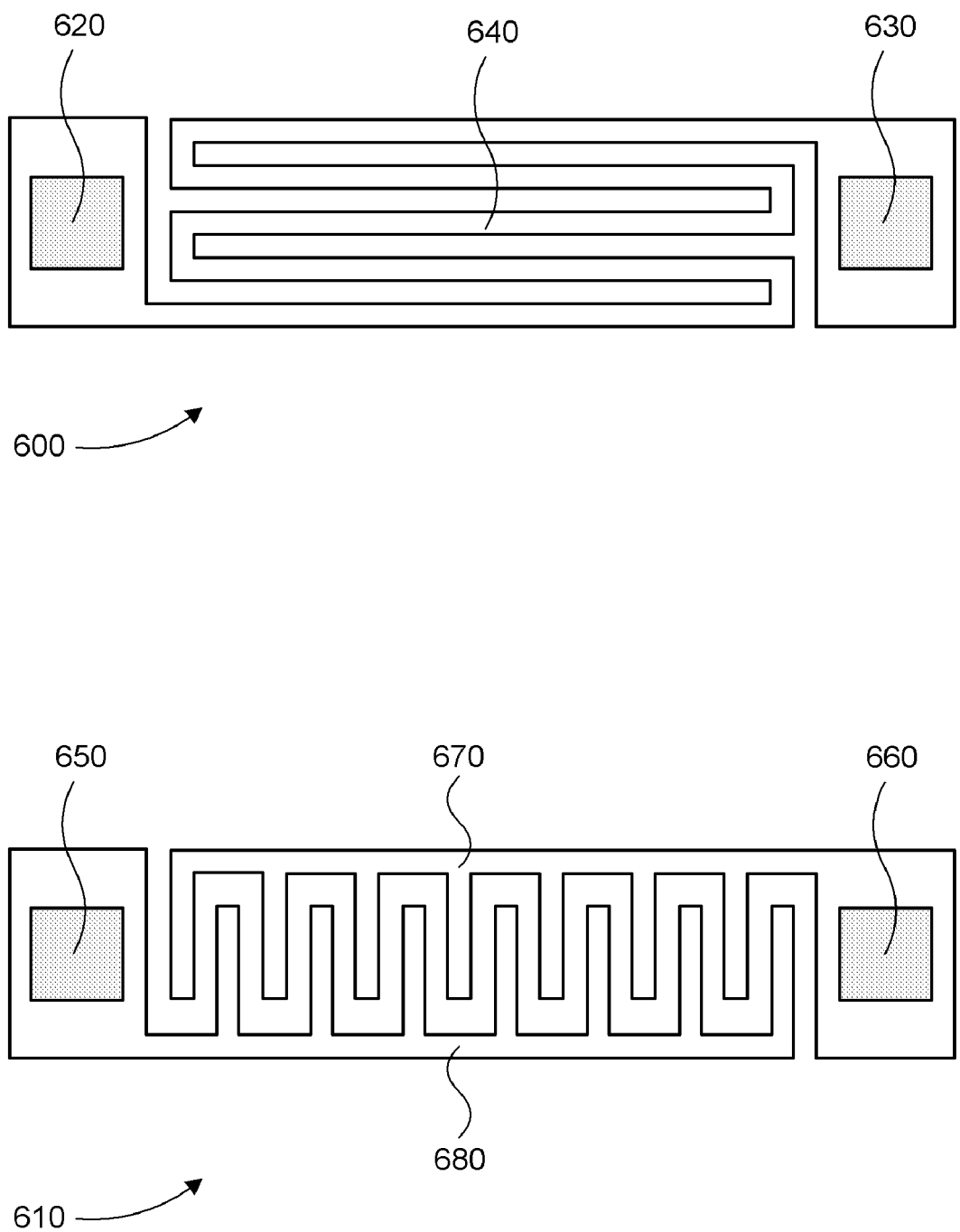
FIG. 6 illustrates a layout approach for a parallel combination of a degeneration resistor and a compensation capacitor within a semiconductor substrate, according to embodiments of the present invention.

FIG. 6 illustrates a layout approach for a parallel combination of a degeneration resistor 600 and a compensation capacitor 610 on a semiconductor substrate, according to embodiments of the present invention. In an embodiment, the layout of degeneration resistor 600 and compensation capacitor 610 can be used to construct any one of the parallel combinations illustrated in FIG. 4, such as the parallel combination of degeneration resistor $R_1$ and compensation capacitor $C_1$.

Degeneration resistor 600 has two end taps 620 and 630 that can be coupled between two controllable switches, such as switch $S_{11}$ and switch $S_{12}$, illustrated in FIG. 4. Degeneration resistor 600 is constructed from polysilicon 640 and is illustrated in FIG. 6 as having a snake pattern. It should be noted that the shape and dimensions of polysilicon 640 are provided herein for exemplary purposes. In general, any shape and/or dimension of polysilicon 640 can be used to construct degeneration resistor 600 without departing from the scope and spirit of the present invention. Polysilicon 640 provides a conductive path between end taps 620 and 630 having a desired resistance.

Compensation capacitor 610 has two end taps 650 and 660 that are coupled to end taps 620 and 630, respectively. In an embodiment, compensation capacitor 610 is constructed from two metal lines 670 and 680 that form the two plates of compensation capacitor 610. It should be noted that any shape and/or dimension of metal lines 670 and 680 can be used to construct compensation capacitor 610 without departing from the scope and spirit of the present invention. In addition, compensation capacitor 610 can further incorporate the use of multiple, metal layers to provide higher-levels of capacitance. As illustrated in FIG. 6, metal lines 670 and 680 are "fingered" and intersperse with each other.

Because compensation capacitor 610 is constructed from metal, compensation capacitor 610 may advantageously reside on top of degeneration resistor 600 on a semiconductor substrate. In general, metal lines of a typical semiconductor process may overlap with polysilicon without directly coupling, unless desired. By placing compensation capacitor 610 on top of degeneration resistor 600, the substrate area required by the parallel combination can be reduced. Using this layout approach, the additional area required by constant-bandwidth VGA 400 (over conventional VGA 200), due to the addition of compensation capacitors, can be reduced significantly, if not eliminated all together.

In another embodiment, compensation capacitor 610 can be constructed from polysilicon and placed adjacent to degeneration resistor 600 on a semiconductor substrate. However, end taps 620 and 630 of degeneration resistor 600 remain coupled to end taps 650 and 660 of compensation capacitor 610, thereby forming a parallel combination.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A constant-bandwidth variable gain amplifier (VGA), comprising:
    a first transistor having a first source;
    a second transistor having a second source;
    a parasitic capacitance coupled between the first and second sources; and
    a degeneration branch coupled between the first and second sources via a controllable switch, the degeneration branch including a parallel combination of a degeneration resistor and a compensation capacitor,
    wherein the compensation capacitor has a capacitance that substantially compensates for a change in bandwidth of the VGA that occurs as a result of the degeneration resistor being coupled between the first and second sources.

2. The constant-bandwidth VGA of claim 1, wherein the degeneration branch further comprises:
    a first controllable switch coupled between the first source and a first node of the parallel combination of the degeneration resistor and the compensation capacitor; and
    a second controllable switch coupled between the second source and a second node of the parallel combination of the degeneration resistor and the compensation capacitor.

3. The constant-bandwidth VGA of claim 2, wherein the gain of the constant-bandwidth VGA is controllable by switching on/off the first and second controllable switches.

4. The constant-bandwidth VGA of claim 1, wherein the small-signal voltage gain of the constant-bandwidth VGA includes a zero that has a frequency location substantially determined by the resistance coupled between the first and second sources and the parasitic capacitance.

5. The constant-bandwidth VGA of claim 4, wherein the frequency location of the zero remains substantially constant when the degeneration resistor is coupled to and decoupled from the first and second sources.

6. The constant-bandwidth VGA of claim 1, wherein:
the gain of the constant bandwidth VGA decreases when the degeneration resistor is coupled between the first and second sources; and
the gain of the constant bandwidth VGA increases when the degeneration resistor is decoupled from the first and second sources.

7. The constant-bandwidth VGA of claim 6, wherein the bandwidth of the constant-bandwidth VGA remains substantial constant over different gain settings.

8. The constant-bandwidth VGA of claim 1, further comprising a plurality of degeneration branches coupled between the first and second sources via controllable switches, each degeneration branch including a parallel combination of a degeneration resistor and a compensation capacitor.

9. The constant-bandwidth VGA of claim 1, wherein the capacitance of the compensation capacitor is determined during simulation.

10. The constant-bandwidth VGA of claim 1, wherein the degeneration resistor is formed from polysilicon and the compensation capacitor is formed from metal on a semiconductor substrate.

11. The constant-bandwidth VGA of claim, 10 wherein the compensation capacitor resides on top of the degeneration resistor on the semiconductor substrate, thereby conserving area.

12. An automatic gain control (AGC) loop, comprising:
a constant-bandwidth variable gain amplifier (VGA) configured to receive an input signal and provide as output an amplified version of the input signal; and
an automatic gain controller configured to receive the amplified version of the input signal and adjust the gain of constant-bandwidth VGA based on a function of the amplified version of the input signal,
wherein the constant-bandwidth VGA comprises:
a first transistor having a first source;
a second transistor having a second source;
a parasitic capacitance coupled between the first and second sources; and
a degeneration branch coupled between the first and second sources via a controllable switch, the degeneration branch including a parallel combination of a degeneration resistor and a compensation capacitor,
wherein the compensation capacitor has a capacitance that substantially compensates for a change in bandwidth of the VGA that occurs as a result of the degeneration resistor being coupled between the first and second sources.

13. The AGC loop of claim 12, wherein the degeneration branch further comprises:
a first controllable switch coupled between the first source and a first node of the parallel combination of the degeneration resistor and the compensation capacitor; and
a second controllable switch coupled between the second source and a second node of the parallel combination of the degeneration resistor and the compensation capacitor.

14. The AGC loop of claim 13, wherein the gain of the constant-bandwidth VGA is controllable by switching on/off the first and second controllable switches.

15. The AGC loop of claim 12, wherein the small-signal voltage gain of the constant-bandwidth VGA includes a zero that has a frequency location substantially determined by the resistance coupled between the first and second sources and the parasitic capacitance.

16. The AGC loop of claim 15, wherein the frequency location of the zero remains substantially constant when the degeneration resistor is coupled to and decoupled from the first and second sources.

17. The AGC loop of claim 12, wherein:
the gain of the constant bandwidth VGA decreases when the degeneration resistor is coupled between the first and second sources; and
the gain of the constant bandwidth VGA increases when the degeneration resistor is decoupled from the first and second sources.

18. The AGC loop of claim 17, wherein the bandwidth of the constant-bandwidth VGA remains substantial constant over different gain settings.

19. The AGC loop of claim 12, further comprising a plurality of degeneration branches coupled between the first and second sources via controllable switches, each degeneration branch including a parallel combination of a degeneration resistor and a compensation capacitor.

20. The AGC loop of claim 12, wherein the capacitance of the compensation capacitor is determined during simulation.

21. The AGC loop of claim 12, wherein the AGC loop is implemented in a serial receiver.

* * * * *